(12) United States Patent
Huangfu et al.

(10) Patent No.: US 9,685,634 B2
(45) Date of Patent: Jun. 20, 2017

(54) PIXEL STRUCTURE, DISPLAY DEVICE AND MANUFACTURING METHOD OF PIXEL STRUCTURE

(71) Applicant: BOE Technology Group Co., Ltd., Beijing (CN)

(72) Inventors: Lujiang Huangfu, Beijing (CN); Wenyu Ma, Beijing (CN); Xinwei Gao, Beijing (CN); Liangjian Li, Beijing (CN); Can Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/912,633

(22) PCT Filed: Jul. 21, 2015

(86) PCT No.: PCT/CN2015/084661
§ 371 (c)(1),
(2) Date: Feb. 18, 2016

(87) PCT Pub. No.: WO2016/127581
PCT Pub. Date: Aug. 18, 2016

(65) Prior Publication Data
US 2016/0359142 A1    Dec. 8, 2016

(30) Foreign Application Priority Data
Feb. 13, 2015 (CN) .......................... 2015 1 0079940

(51) Int. Cl.
*H01L 33/00* (2010.01)
*H01L 51/52* (2006.01)
(Continued)

(52) U.S. Cl.
CPC .......... *H01L 51/5271* (2013.01); *H01L 27/32* (2013.01); *H01L 27/3246* (2013.01);
(Continued)

(58) Field of Classification Search
CPC ............. H01L 27/14629; H01L 31/054; H01L 33/405; H01L 51/5271
(Continued)

(56) References Cited

U.S. PATENT DOCUMENTS 7,091,658 B2 * 8/2006 Ito ....................... H01L 27/3246
313/504
2008/0169461 A1 * 7/2008 Park ..................... H01L 51/5271
257/40

FOREIGN PATENT DOCUMENTS

CN        103915482 A    7/2014
CN        104241535 A   12/2014
(Continued)

OTHER PUBLICATIONS

International Search Report and Written Opinion for International Application No. PCT/CN2015/084661, dated Nov. 20, 2015, 13 pages.
(Continued)

*Primary Examiner* — Tan N Tran
(74) *Attorney, Agent, or Firm* — Westman, Champlin & Koehler, P.A.

(57) ABSTRACT

A pixel structure, a display device having the pixel structure and a manufacturing method of the pixel structure are disclosed. The pixel structure comprises: a first insulation layer; a luminescent unit disposed on the first insulation layer and comprising a first electrode layer, a luminescent layer and a second electrode layer; a pixel defining layer configured for defining a pixel aperture, in which the luminescent unit is disposed; and a reflective assembly disposed around the pixel defining layer so as to reflect light entering the pixel defining layer from the luminescent layer to exit from an exit surface of the pixel structure. The reflective assembly is provided to reflect the light entering the pixel defining layer from the luminescent layer, so as to exit from the exit surface of the pixel structure. As a result, the light beams entering the pixel defining layer may be converted into effective beams for the pixel structure, thereby improving the display effect and reducing light dissipation.

18 Claims, 7 Drawing Sheets

(51) Int. Cl.
H01L 27/32 (2006.01)
H01L 51/00 (2006.01)

(52) U.S. Cl.
CPC ........ *H01L 27/3283* (2013.01); *H01L 51/001* (2013.01); *H01L 51/0011* (2013.01); *H01L 51/5218* (2013.01); *H01L 2251/5307* (2013.01)

(58) Field of Classification Search
USPC .................................................. 257/98, 99
See application file for complete search history.

(56) References Cited

FOREIGN PATENT DOCUMENTS

| | | |
|---|---|---|
| CN | 104733501 A | 6/2015 |
| CN | 204391161 U | 6/2015 |

OTHER PUBLICATIONS

English translation of Box No. V of the Written Opinion for the International Searching Authority for International Application No. PCT/CN2015/084661, 2 pages.

\* cited by examiner

PIXEL STRUCTURE, DISPLAY DEVICE AND MANUFACTURING METHOD OF PIXEL STRUCTURE

CROSS-REFERENCE TO RELATED APPLICATION

This application is a Section 371 National Stage Application of International Application No. PCT/CN2015/084661, filed on Jul. 21, 2015, entitled "PIXEL STRUCTURE, DISPLAY DEVICE AND MANUFACTURING METHOD OF PIXEL STRUCTURE", which has not yet published, which claims priority to Chinese Application No. 201510079940.9, filed on Feb. 13, 2015, incorporated herein by reference in their entirety.

BACKGROUND OF THE INVENTION

Field of the Invention

Embodiments of the present invention relate to a display device, in particular, to a pixel structure, a display device having the pixel structure, and a manufacturing method of the pixel structure.

Description of the Related Art

Currently, an organic light emitting diode (OLED) unit and an active matrix organic light emitting diode (AMOLED) unit are widely used in a display device as an organic film electroluminescent device, due to their characteristics such as an excellent shock resistance, a wide visual angle, a broad range of operation temperature, a high contrast, an ability of flexible display, etc. In general, a pixel structure comprises a pixel defining layer (PDL) for defining a pixel aperture and an OLED unit disposed in the pixel aperture. The OLED unit comprises a first electrode layer, a second electrode layer and an organic luminescent layer packaged therebetween. A voltage is applied between the first electrode layer and the second electrode layer to excite the organic luminescent layer to emit light, the emitted light then exits from the pixel aperture.

In the OLED unit, the light emitted from the organic luminescent layer under a certain range of incident angles undergoes a total reflection on a surface of the organic luminescent layer and is then transmitted inside the organic luminescent layer, thereby an optical waveguide mode is produced inside the organic luminescent layer. At an interface between an edge of the organic luminescent layer and the pixel defining layer, light beams in a certain range of incident angles are possible to deviate from the light waveguide mode inside the organic luminescent layer and enter the pixel defining layer because the refractive index of the organic luminescent layer is close to that of the pixel defining layer. These light beams are substantially laterally transmitted, that is, they are transmitted in a direction which is substantially perpendicular to an emitted-light direction required for an effective display of the pixel structure. These light beams which are substantially laterally transmitted will be finally dissipated in the pixel defining layer if they are not controlled.

SUMMARY OF THE INVENTION

Embodiments of the present invention provide a pixel structure, a display device having the pixel structure, and a manufacturing method of the pixel structure, so as to improve a display effect and reduce light dissipation.

According to an embodiment of the present invention, it is provided a pixel structure comprising:

a first insulation layer;

a luminescent unit disposed on the first insulation layer and comprising a first electrode layer, a luminescent layer and a second electrode layer;

a pixel defining layer configured for defining a pixel aperture, in which the luminescent unit is disposed; and a reflective assembly disposed around the pixel defining layer so as to reflect light entering the pixel defining layer from the luminescent layer to exit from an exit surface of the pixel structure.

In the pixel structure according to the embodiment of the present invention, the reflective assembly comprises:

a second insulation layer located at a periphery of the pixel defining layer and disposed on the first insulation layer;

a groove formed between the second insulation layer and the pixel defining layer; and a reflective layer disposed at a side of the groove located at the second insulation layer to reflect the light transmitted through the pixel defining layer.

In the pixel structure according to the embodiment of the present invention, a bottom of the groove extends into at least a portion of the thickness of the first insulation layer.

In the pixel structure according to the embodiment of the present invention, the pixel defining layer covers outer edges of the first electrode layer.

In the pixel structure according to the embodiment of the present invention, the second insulation layer and the pixel defining layer are formed in the same layer and made from the same material, and the second insulation layer has the same height as the pixel defining layer.

In the pixel structure according to the embodiment of the present invention, the second insulation layer and the pixel defining layer are formed in the same layer and made from the same material, and the height of the second insulation layer is larger than the height of the pixel defining layer.

In the pixel structure according to the embodiment of the present invention, the reflective layer and the first electrode layer are formed in the same layer and made from the same material.

In the pixel structure according to the embodiment of the present invention, the reflective layer is disconnected from the first electrode layer.

In the pixel structure according to the embodiment of the present invention, the height of the second insulation layer is larger than the height of the pixel defining layer.

In the pixel structure according to the embodiment of the present invention, the reflective layer has a surface of bowl shape.

In the pixel structure according to the embodiment of the present invention, the reflective assembly comprises:

a second insulation layer located at a periphery of the pixel defining layer and disposed on the first insulation layer; and a reflective layer disposed on an inner wall of the second insulation layer facing towards the pixel defining layer side to reflect the light emitted from the pixel defining layer, wherein an outer surface of the pixel defining layer contacts the reflective layer.

In the pixel structure according to the embodiment of the present invention, the reflective layer and the first electrode layer are formed in the same layer and made from the same material.

In the pixel structure according to the embodiment of the present invention, the reflective layer is disconnected from the first electrode layer.

According to an embodiment in another aspect, it is provided a display device comprising the pixel structure according to any one of the above embodiments.

According to an embodiment in another further aspect, it is provided a manufacturing method of a pixel structure, each pixel structure comprising a pixel defining layer and a luminescent unit disposed in a pixel aperture of the pixel defining layer, wherein the manufacturing method comprises steps of:

forming a first insulation layer on a substrate;

forming a first electrode layer of the luminescent unit on the first insulation layer;

forming an insulation film surrounding the first electrode layer on the first insulation layer;

forming a reflective assembly on the insulation film; and forming a luminescent layer and a second electrode layer on the first electrode layer inside the reflective assembly such that the reflective assembly reflects light entering the pixel defining layer from the luminescent layer to exit from an exit surface of the pixel structure.

In the manufacturing method according to the embodiment of the present invention, the step of forming a reflective assembly on the insulation film comprises:

forming an annular groove on the insulation film through a patterning process so as to separate the insulation film into a second insulation layer located outside and the pixel defining layer located inside;

forming a reflective layer on a wall of the groove located outside.

In the manufacturing method according to the embodiment of the present invention, a bottom of the groove extends into at least a portion of a thickness of the first insulation layer.

In the manufacturing method according to the embodiment of the present invention, the step of forming an insulation film surrounding the first electrode layer on the first insulation layer comprises forming the insulation film to cover outer edges of the first electrode layer.

In the manufacturing method according to the embodiment of the present invention, the step of forming an insulation film surrounding the first electrode layer on the first insulation layer comprises forming the insulation film with stepped portions thereon, a height of the stepped portions located inside being smaller than that located outside.

According to an embodiment in another further aspect, it is provided a manufacturing method of a pixel structure, comprising steps of:

forming a first insulation layer on a substrate;

forming an annular second insulation layer on the first insulation layer;

forming a first electrode layer and a reflective layer through a single patterning process, wherein the first electrode layer is formed on the first insulation layer, the reflective layer extends from the first insulation layer to an inner surface of the second insulation layer, and the first electrode layer is disconnected from the reflective layer;

forming a pixel defining layer on outer edges of the first electrode layer; and forming a luminescent layer and a second electrode layer on the first electrode layer such that the reflective layer reflects light entering the pixel defining layer from the luminescent layer to exit from an exit surface of the pixel structure.

In the manufacturing method according to the embodiment of the present invention, the step of forming a pixel defining layer on outer edges of the first electrode layer comprises forming a groove between an outer surface of the pixel defining layer and an inner surface of the second insulation layer.

In the manufacturing method according to the embodiment of the present invention, the step of forming a pixel defining layer on outer edges of the first electrode layer comprises forming the pixel defining layer with a height less than a height of the second insulation layer.

In the manufacturing method according to the embodiment of the present invention, the step of forming a pixel defining layer on outer edges of the first electrode layer comprises enabling an outer surface of the pixel defining layer to contact the reflective layer on an inner surface of the second insulation layer.

In the pixel structure, the display device having the pixel structure and the manufacturing method of the pixel structure according to the above embodiments of the present invention, the reflective assembly is provided to reflect the light entering the pixel defining layer from the luminescent layer, so as to exit from the exit surface of the pixel structure. As a result, the light beams entering the pixel defining layer may be converted into effective beams for the pixel structure, thereby improving the display effect and reducing light dissipation.

BRIEF DESCRIPTION OF THE DRAWINGS

For the purpose of illustrating the object, technical solution and advantages of the present invention more clearly, the present invention will be further described in detail in combination with the following specific embodiments and with reference to the attached drawings, in which.

DETAILED DESCRIPTION OF PREFERRED EMBODIMENTS OF THE INVENTION

Figure 1:
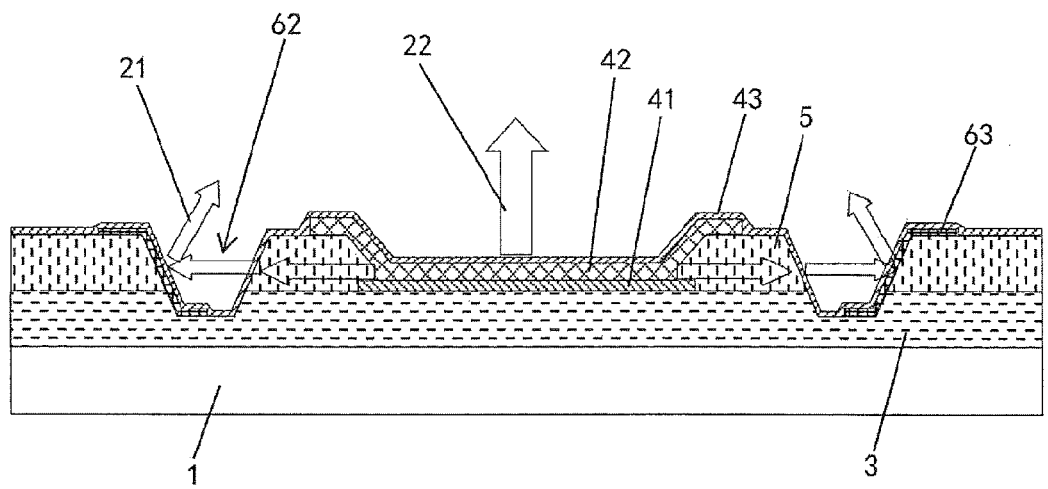
FIG. 1 is a schematic section view of a pixel structure according to an embodiment of the present invention, showing a principle on which a reflective layer reflects incident light from a pixel defining layer.

The technical solutions of the present invention will be further described in detail by means of the following embodiments and in combination with the drawings. The same or similar reference numerals indicate the same or similar elements throughout the specification. The following description of implementations of the present invention with reference to the drawings is intended to explain the general concept of the present invention, rather than being understood as limiting the present invention.

According to a general inventive concept of the present invention, there is provided a pixel structure comprising: a first insulation layer; a luminescent unit disposed on the first insulation layer and comprising a first electrode layer, a luminescent layer and a second electrode layer; a pixel defining layer configured for defining a pixel aperture, in which the luminescent unit is disposed; and a reflective assembly disposed around the pixel defining layer so as to reflect light entering the pixel defining layer from the luminescent layer to exit from an exit surface of the pixel structure. In the above pixel structure, the reflective assembly is provided to reflect the light entering the pixel defining layer from the luminescent layer, so as to exit from the exit surface of the pixel structure. As a result, the light beams entering the pixel defining layer may be converted into effective beams for the pixel structure, thereby improving the display effect and reducing light dissipation.

In the following detailed description, for purposes of explanation, numerous specific details are explained to provide a thorough understanding of embodiments of the present disclosure. Obviously, however, one or more embodiments without these specific details may also be implemented. In other instances, well-known structures and devices are shown in schematic diagrams so as to simplify the accompanying drawings.

FIG. 1 is a schematic section view of a pixel structure according to an embodiment of the present invention, showing a principle on which a reflective layer reflects incident light from a pixel defining layer. As shown in FIG. 1, the pixel structure according to an embodiment of the present invention comprises: a first insulation layer 3; a luminescent unit; a pixel defining layer 5 and a reflective assembly. The luminescent unit is disposed on the first insulation layer 3 and comprises a first electrode layer 41, a second electrode layer 43 and a luminescent layer 42 disposed between the first and second electrode layers 41, 43. The pixel defining layer 5 is configured for defining a pixel aperture for display. The luminescent unit is disposed in the pixel aperture. The reflective assembly is disposed around the pixel defining layer 5 so as to reflect light 21 entering into the pixel defining layer 5 from the luminescent layer 42 to exit from an exit surface of the pixel structure. In various embodiments of the present invention, a technical term "exit surface of the pixel structure" is intended to mean a surface through which the light may irradiate outside the pixel structure. FIG. 1 shows a transmission path in which the light 21 emitted from the luminescent layer 42 passes through the pixel defining layer 5 and a reflective layer 62 and exits from the pixel structure. As a result, the light beams emitted from the luminescent layer 42 into the pixel defining layer 5 may exit from the exit surface of the pixel structure due to a small incident angle, so that these light beams 21 are possible to mix with primary light beams 22 emitted from a display surface of the pixel structure to form a display light beam, thereby improving the display effect of the pixel structure and reducing light dissipation.

The first insulation layer 3 may be formed from at least one of materials such as $SiO_x$, $SiN_x$, $SiN_xO_y$.

As an example, in the luminescent unit used in the OLED display, the first electrode layer may be an anode while the second electrode may be a cathode, this case is referred to as a forward biased structure; alternatively, the first electrode layer may be a cathode while the second electrode may be an anode, this case is referred to as a reverse biased structure. The luminescent layer may be an organic luminescent layer, or may also comprise one or at least two of an electron injection layer, an electron transport layer, a hole transport layer and a hole injection layer depending on improved performances required.

In an embodiment, as shown in FIG. 1, the reflective assembly comprises: a second insulation layer 61 located around the periphery of the pixel defining layer 5 and disposed on the first insulation layer 3; a groove 62 formed between the second insulation layer 61 and the pixel defining layer 5; and a reflective layer 63 disposed on a side of the groove 62 located on the second insulation layer 61 to reflect the light 21 passing through the pixel defining layer 5. A portion of the luminescent layer 42 is disposed on the pixel defining layer 5 and the refractive index of the organic luminescent layer is close to that of the pixel defining layer, so that the light 21 passing through the pixel defining layer 5 enters onto the reflective layer 63 in a plurality of directions. A reflective surface of the reflective layer 63 is designed as an inclined, an arcuate or a parabolic surface so as to enable the light beams entering the reflective layer 63 to be able to exit from the exit surface of the pixel structure, for example in a direction which is substantially perpendicular to the exit surface, to form effective display light beams, a display effect is thus improved. As such, an outer sidewall of the groove 62 surrounding the pixel defining layer 5 is formed as a bowl shape. It should be understood that there is no particular limitation for an inner sidewall (i.e. a sidewall opposite to the reflective layer) of the groove 62 as long as it ensures that the light 21 which is transmitted substantially laterally in the pixel defining layer has a small incident angle which will not lead to a total reflection.

In an embodiment, the pixel structure further comprises: a substrate 1, for example formed from glass or transparent resin material; and a pixel driving unit layer (not shown) disposed on the substrate 1. The first insulation layer 3 is disposed on the pixel driving unit layer. The first electrode layer 41 is electrically connected to a drain electrode (not shown) of a thin film transistor in the pixel driving unit layer through a via hole (not shown) formed in the first insulation layer 3, so that the thin film transistor provides a driving signal for the first electrode layer 41. The first insulation layer 3 may comprise a passivation layer and/or a planarizing layer.

Figure 2A:
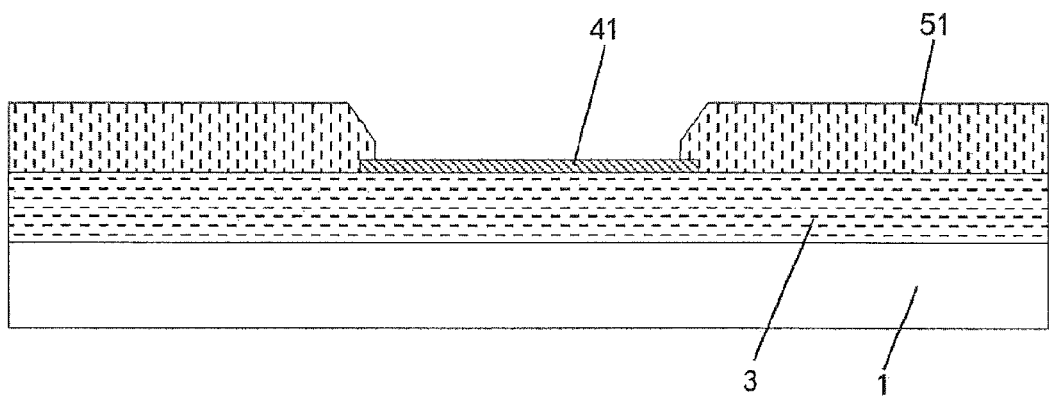
FIGS. 2a-2d are section views showing operation processes of manufacturing the pixel structure according to the embodiment of the present invention.
Figure 2B:
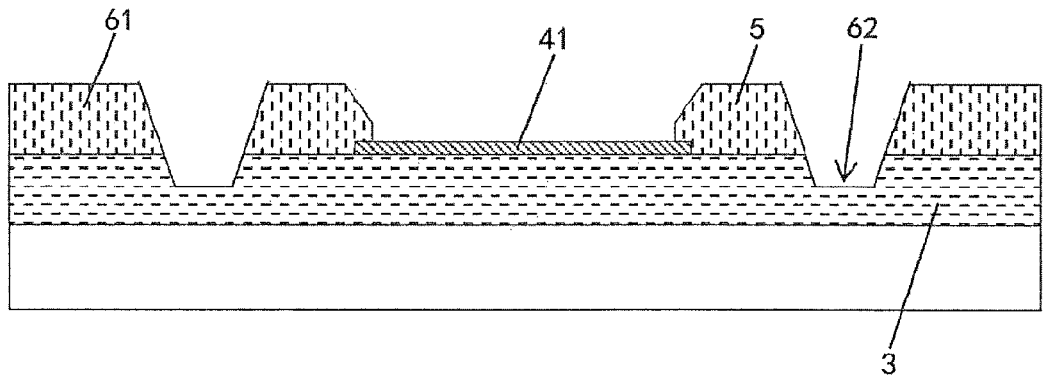

In an embodiment, as shown in FIG. 2b, the bottom of the groove 62 extends into at least a portion of the thickness of the first insulation layer 3. As a result, an end of the reflective layer 63 is possible to extend into the first insulation layer 3 to totally reflect the light 21 from the pixel defining layer 5.

In an embodiment, the pixel defining layer 5 covers outer edges of the first electrode layer 41. As a result, it is possible to prevent the first electrode layer 41 from an electrical breakdown so as to improve a performance of the luminescent assembly, and it is also possible to attach the first electrode layer 41 to the first insulation layer firmly.

In an exemplary embodiment, as shown in FIG. 1, the second insulation layer 61 and the pixel defining layer 5 are formed in the same layer and formed from the same material. Moreover, the second insulation layer and the pixel defining layer have the substantially same height. As an example, both the second insulation layer 61 and the pixel defining layer 5 are formed from photosensitive organic material. As a result, it is possible for the second insulation layer 61 and the pixel defining layer 5 to be formed through a single patterning process by using the same material, thereby reducing the number of patterning processes and reducing the number of masks used, thus a manufacturing process of an array substrate is simplified and a manufacturing cost is reduced.

Figure 3:
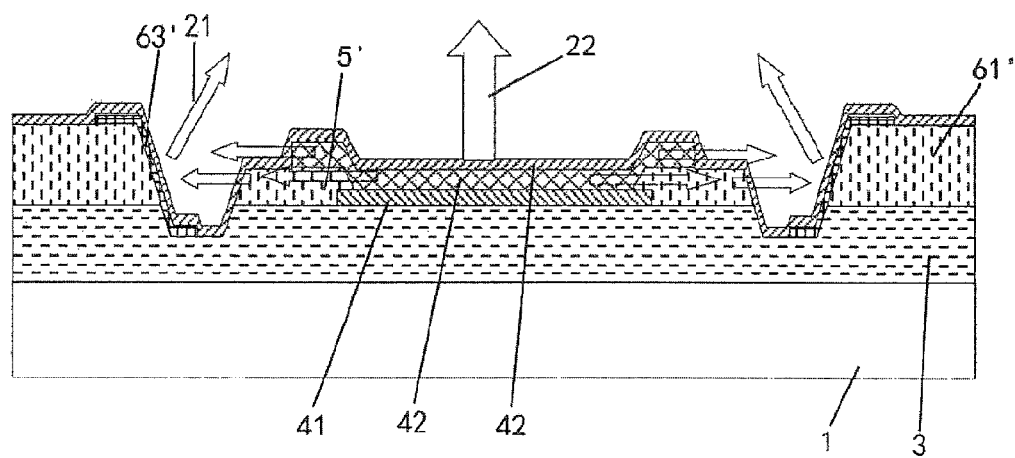
FIG. 3 is a schematic section view of a pixel structure according to an embodiment of the present invention, showing a principle on which a reflective layer reflects incident light from a pixel defining layer, in which the height of a second insulation layer is larger than the height of a pixel defining layer.

FIG. 3 is a schematic section view of a pixel structure according to an embodiment of the present invention, showing a principle on which a reflective layer reflects incident light from a pixel defining layer. The pixel structure in FIG. 3 differs from that in FIG. 1 in height of the pixel defining layer, while other identical components employ the same or similar reference numerals. Only the pixel defining layer 5' of the pixel structure in FIG. 3 will be described hereinafter, and other structures which are the same as or similar to the respective structures of the pixel structures in FIG. 1 will be omitted hereinafter.

Figure 4A:
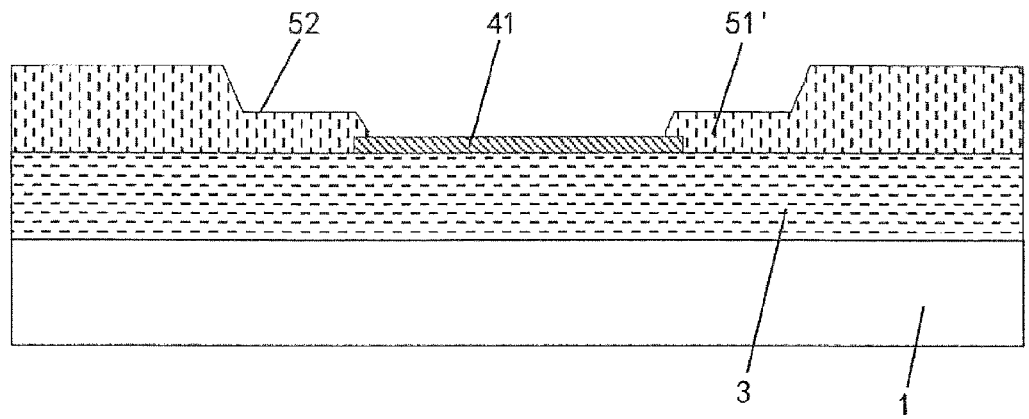
FIGS. 4a-4c are section views showing operation processes of manufacturing the pixel structure in FIG. 3.

In the pixel structure, as shown in FIGS. 3 and 4a, the second insulation layer 61' and the pixel defining layer 5' are formed in the same layer and formed from the same material. Moreover, the height of the second insulation layer 61' is larger than that of the pixel defining layer 5'. As a result, even if edges of the luminescent layer 42 of the luminescent assembly cover at least a portion of upper portions of the pixel defining layer 5', the reflective layer 63' disposed in the groove 62' is substantially flush with the luminescent layer 42 in thickness direction as the height of the second insulation layer 61' is larger than that of the pixel defining layer 5', so that the reflective layer 63' is able to reflect the light 21 which enters the luminescent layer positioned above the pixel defining layer 5' due to the continuation of waveguide effect in the luminescent layer and then irradiates onto the reflective layer 63'. Thus, these light beams 21 are possible to mix with primary light beams 22 emitted from a display surface of the pixel structure to form a display light beam, thereby improving the display effect of the pixel structure and reducing light dissipation.

In the above pixel structures, the reflective layer and the first electrode layer may be formed from the same material, such as three-layer material having ITO-Ag-ITO (Indium Tin Oxide), silver or aluminum or the like, which enables the reflective layer and the first electrode layer to have a good reflective performance and enables the first electrode layer to realize an electric conductive function. As a result, a cost may be reduced while a useful life of the reflective layer and the first electrode layer may be increased. In an alternative embodiment, the reflective layer and the first electrode layer may be formed from different materials, for example, the reflective layer may be formed from insulated material as it is not necessary to have an electric conductive function.

Figure 5:
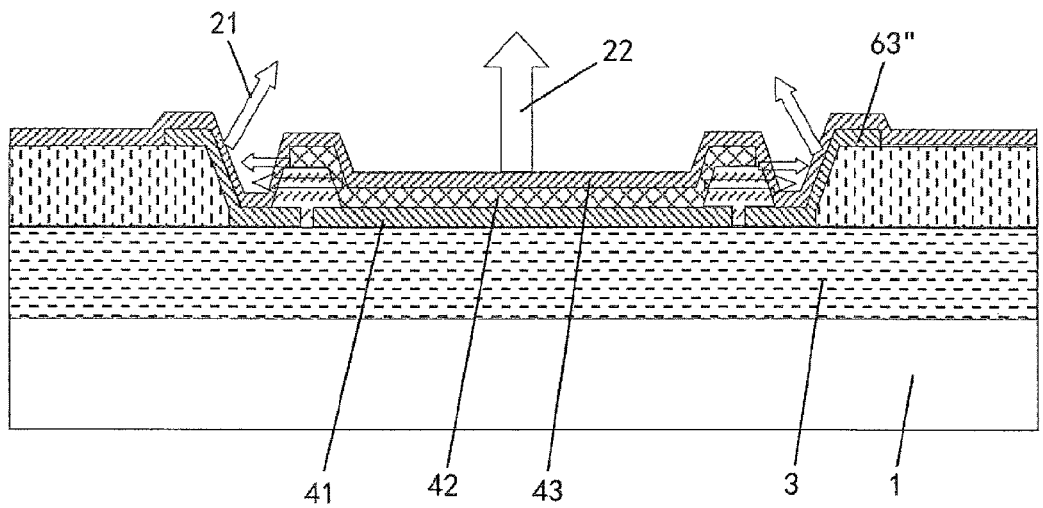
FIG. 5 is a schematic section view of a pixel structure according to an embodiment of the present invention, showing a principle on which a reflective layer reflects incident light from a pixel defining layer, in which a reflective layer and a first electrode layer are formed in the same layer.

FIG. 5 is a schematic section view of a pixel structure according to an embodiment of the present invention, showing a principle on which a reflective layer reflects incident light from a pixel defining layer. The pixel structure in FIG. 5 differs from that in FIG. 1 in the pixel defining layer and the reflective layer, while other identical components employ the same or similar reference numerals. Only the pixel defining layer 5" and the reflective layer 63" of the pixel structure in FIG. 5 will be described hereinafter, and other structures which are the same as or similar to the respective structures of the pixel structures in FIG. 1 will be omitted hereinafter.

Figure 6A:
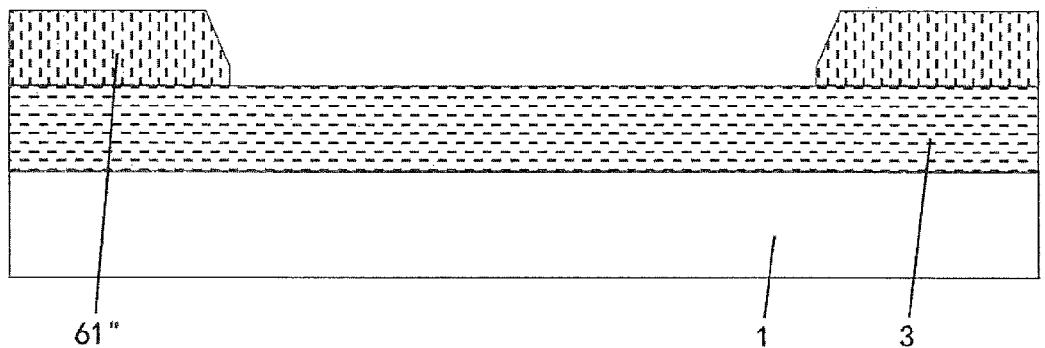
FIGS. 6a-6d are section views showing operation processes of manufacturing the pixel structure in FIG. 5.
Figure 6B:
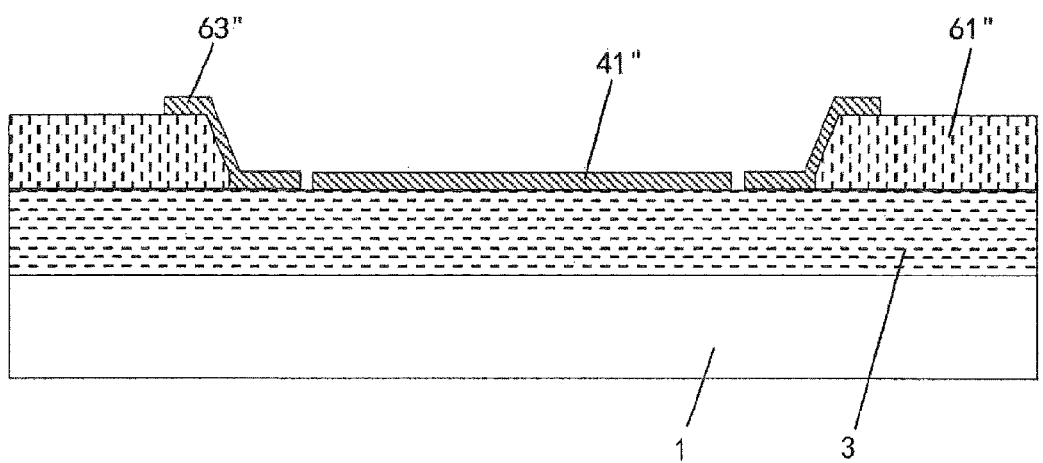

In the pixel structure, as shown in FIG. 6b, the reflective layer 63" and the first electrode layer 41" are formed in the same layer and formed from the same material. As a result, it is possible for the reflective layer 63" and the first electrode layer 41" to be formed through a single patterning process by using the same material, thereby reducing the number of the patterning processes and reducing the number of masks used, thus a manufacturing process of an array substrate is simplified and a manufacturing cost is reduced. As an example, the reflective layer 63" and the first electrode layer 41" may be formed from material such as three-layer material having ITO-Ag-ITO (Indium Tin Oxide), silver or aluminum or the like, which enables the reflective layer and the first electrode layer to have a good reflective performance and is able to increase the useful life of the reflective layer and the first electrode layer.

Figure 6C:
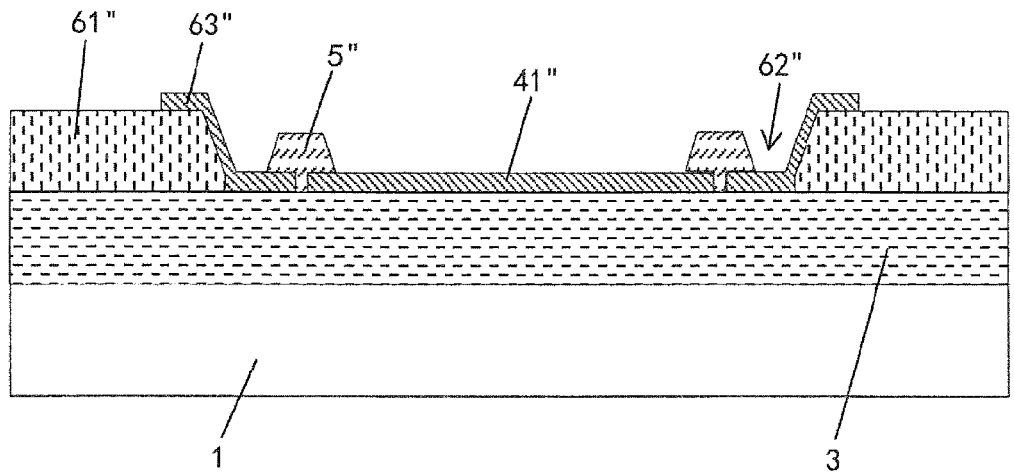

In certain embodiments, as shown in FIGS. 5 and 6c, the height of the second insulation layer 61" is larger than that of the pixel defining layer 5". As a result, even if edges of the luminescent layer 42 of the luminescent assembly cover at least a portion of upper portions of the pixel defining layer 5", the reflective layer 63" disposed in the groove 62" is substantially flush with the luminescent layer 42 in thickness direction as the height of the second insulation layer 61" is larger than that of the pixel defining layer 5", so that the reflective layer 63" is able to reflect the light 21 which enters the luminescent layer positioned above the pixel defining layer 5" due to the continuation of waveguide effect in the luminescent layer and then irradiates onto the reflective layer 63". FIG. 5 shows a transmission path in which the light 21 emitted from the luminescent layer 42 passes through the pixel defining layer 5" and the reflective layer 63" and exits from the pixel structure. These light beams 21 are possible to mix with primary light beams 22 emitted from a display surface of the pixel structure to form a display light beam, thereby improving the display effect of the pixel structure and reducing light dissipation. It should be understood that the second insulation layer 61" and the pixel defining layer 53 may be formed from the same material or different materials.

Figure 7:
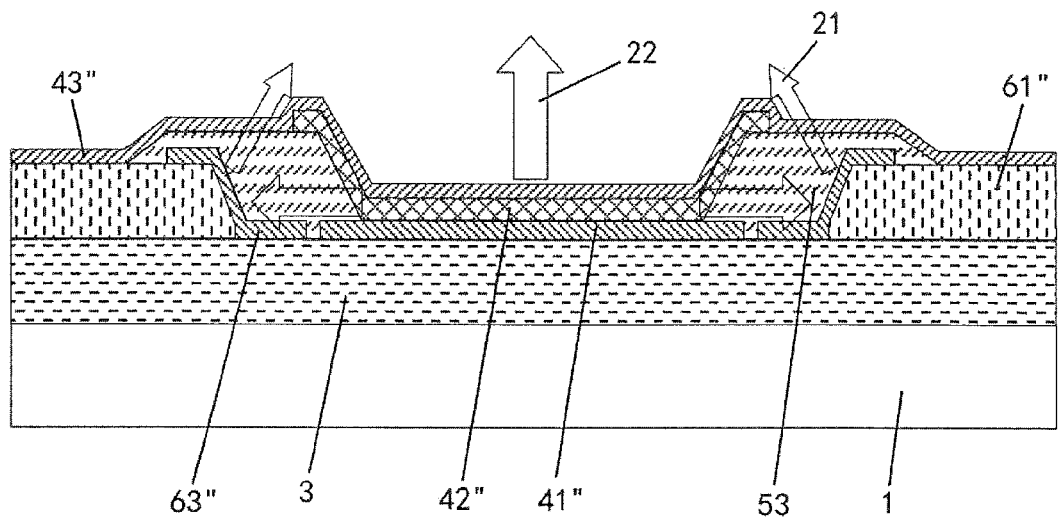
FIG. 7 is a schematic section view of a pixel structure without any grooves according to an embodiment of the present invention, showing a principle on which a reflective layer reflects incident light from a pixel defining layer.

FIG. 7 is a schematic section view of a pixel structure according to an embodiment of the present invention, showing a principle on which a reflective layer reflects incident light from a pixel defining layer. The pixel structure in FIG. 7 differs from that in FIG. 5 in the pixel defining layer, while other identical components employ the same or similar reference numerals. Only the pixel defining layer 53 of the pixel structure in FIG. 7 will be described hereinafter, and other structures which are the same as or similar to the respective structures of the pixel structures in FIG. 1 or FIG. 5 will be omitted hereinafter.

As shown in FIG. 7, the reflective layer 63" is disposed on inner walls of a side of the second insulation layer 61" facing towards the pixel defining layer 53, so as to reflect light 21 exiting from the pixel defining layer. An outer surface of the pixel defining layer 53 contacts the reflective layer 63". In other words, the pixel defining layer 53 extends outward to the reflective layer 63", in which the groove 62" in the pixel structure as shown in FIG. 5 is eliminated. As a result, the light passing through the pixel defining layer 53 is possible to irradiate on the reflective layer 63" directly, thereby avoiding the light from entering an air layer to be refracted, thus a reflective effect of the reflective layer 63" is improved. These light beams 21 are possible to mix with primary light beams 22 emitted from a display surface of the pixel structure to form a display light beam, thereby improving the display effect of the pixel structure and reducing light dissipation. It should be understood that the second insulation layer 61" and the pixel defining layer 53 may be formed from the same material or different materials.

According to certain embodiments of the present invention, it is provided a display device comprising the pixel structure according to any one of the above embodiments.

The display device may be any products or components having display function, such as a display panel, a mobile phone, a tablet computer, a television, a display, a laptop, a digital photo frame, a navigator, an electronic paper, etc.

According to some embodiments of the present invention, a manufacturing method of the pixel structure is provided. As shown in FIG. 1, each pixel structure comprises the pixel defining layer 5 and the luminescent unit disposed in the pixel aperture of the pixel defining layer. The manufacturing method comprises steps of:

forming the first insulation layer 3 on the substrate 1, for example, the first insulation layer may comprise a passivation layer and/or a planarizing layer;

forming the first electrode layer 41 of the luminescent unit on the first insulation layer 3;

forming an insulation film 51 around the first electrode layer 41 on the first insulation layer 3;

forming the reflective assembly on the insulation film 51;

forming the luminescent layer 42 and the second electrode layer 43 on the first electrode layer 41 inside the reflective assembly so that the reflective assembly reflects the light entering the pixel defining layer 5 from the luminescent layer 42 to exit from the exit surface of the pixel structure. As an example, the reflective assembly reflects the light entering the pixel defining layer 5 from the luminescent layer 42 to exit in a direction which is substantially parallel to the exit direction of the pixel structure. As a result, light beams entering the pixel defining layer 5 from the luminescent layer 42 are possible to exit from the exit surface of the pixel structure, thereby improving the display effect of the pixel structure and reducing light dissipation.

In an embodiment, the step of forming the reflective assembly in the insulation film 51 comprises:

forming an annular groove 62 in the insulation film 51 through patterning process so as to separate the insulation film 51 into the second insulation layer 61 located outside and the pixel defining layer 5 located inside;

forming the reflective layer 63 on an outer wall of the groove 62.

Figure 2C:
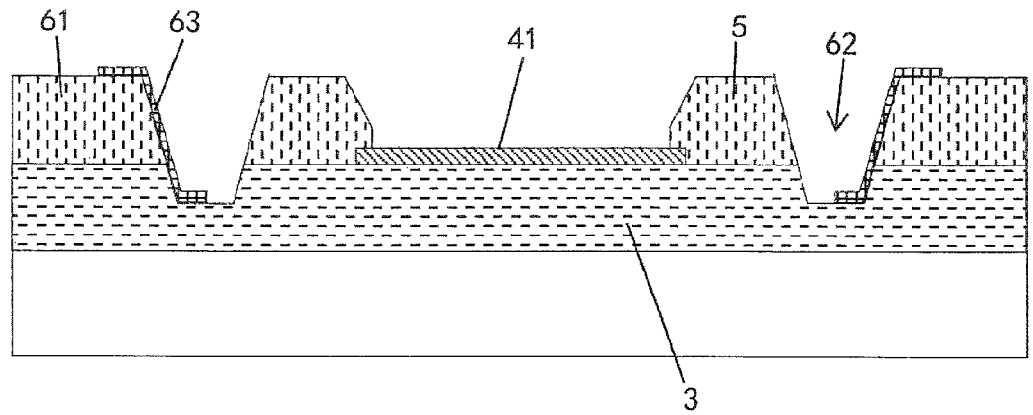
Figure 2D:
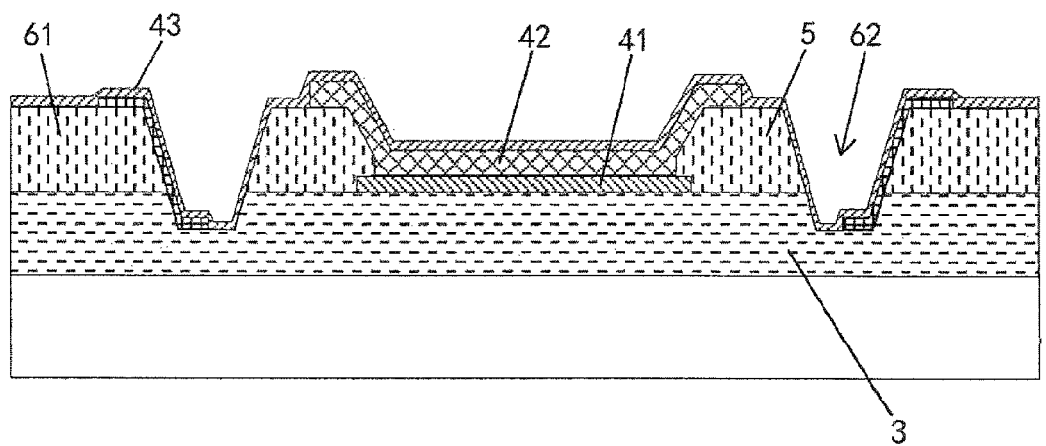

Specifically, FIGS. 2a-2d are section views showing operation processes of manufacturing the pixel structure in FIG. 1. The manufacturing method of the pixel structure comprises steps of:

forming the pixel driving unit layer (not shown) comprising the thin film transistor on the substrate 1 formed from glass or transparent resin, for example, which is similar to common manufacturing processes of OLED or AMOLED;

forming the first insulation layer 3 on the pixel driving unit layer; as an example, the first insulation layer may comprise planarizing layer and/or passivation layer. In certain embodiments, the first insulation layer 3 may be formed by covering an organic film layer formed from materials such as acryl or polyimide (PI) and through a patterning process comprising exposure, development and etching processes, for example, or may be formed by coating photosensitive organic material and by using a patterning process comprising exposure and development processes, for example;

forming the first electrode layer 41 of the luminescent unit on the first insulation layer 3, wherein the first electrode layer 41 may be used as a reflective electrode, for example;

forming the insulation film 51 around the first electrode layer 41 on the first insulation layer 3, as shown in FIG. 2a, and forming the pixel aperture in the insulation film 51, wherein the insulation film and the first insulation layer may be formed from the same material;

etching the groove 62 in the insulation film around outer sides of the pixel aperture through patterning or dry etching process, as shown in FIG. 2b, so that the insulation film 51 is separated into the pixel defining layer 5 located inside and the second insulation layer 61 located outside by the groove 62; in certain embodiments, the bottom of the groove 62 extends into at least a portion of the thickness of the first insulation layer 3. In other words, the groove 62 passes through the insulation film and ends in the first insulation layer 3 in a depth direction. As a result, an end of the reflective layer 63 can extend into the first insulation layer 3 so as to reflect totally the light from the pixel defining layer 5. Slopes or inclination angles of two sides of the groove 62 may be determined depending on a direction in which the light in the pixel defining layer is transmitted in the waveguide mode and/or an object of reflecting the light exiting from the pixel defining layer towards the effective display direction;

forming the reflective layer 63 on the inner walls of the groove 62 located outside, as shown in FIG. 2c; as an example, forming a reflective metal layer by depositing materials such as Ag, Al or the like through physical vapor deposition process and then removing the reflective metal layer on other portions through patterning, wet etching or dry etching process while keeping the reflective metal layer on the inner walls of the groove 62 located outside so as to form a one-side reflective layer 63;

as shown in FIG. 2d, depositing an OLED organic film layer through fine metal mask (FMM) and evaporation processes to form the luminescent layer 42; then forming a transparent or transflective second electrode layer 43 through evaporation process.

As a result, the pixel structure according to an embodiment of the present invention may be formed through the above steps. The reflective layer 63 formed in the groove 62 can reflect the light which is propagated laterally in the pixel defining layer 5 to exit from the exit surface of the pixel structure, and thus to form the light contributing to the display effect, thereby improving display effect and reducing light dissipation.

In an embodiment, the step of forming an insulation film 51 around the first electrode layer 41 on the first insulation layer 3 comprises forming the insulation film 51 to cover outer edges of the first electrode layer. As a result, it is possible to prevent the first electrode layer 41 from an electrical breakdown so as to improve a performance of the luminescent assembly.

Figure 4B:
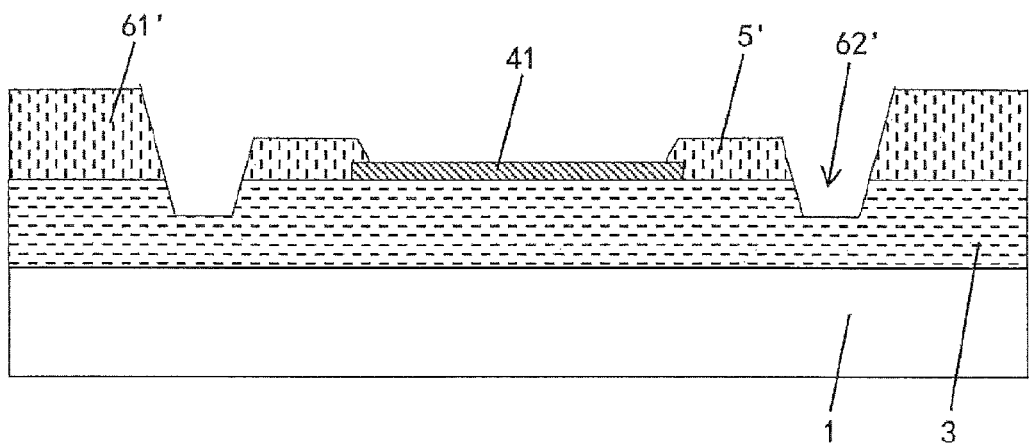
Figure 4C:
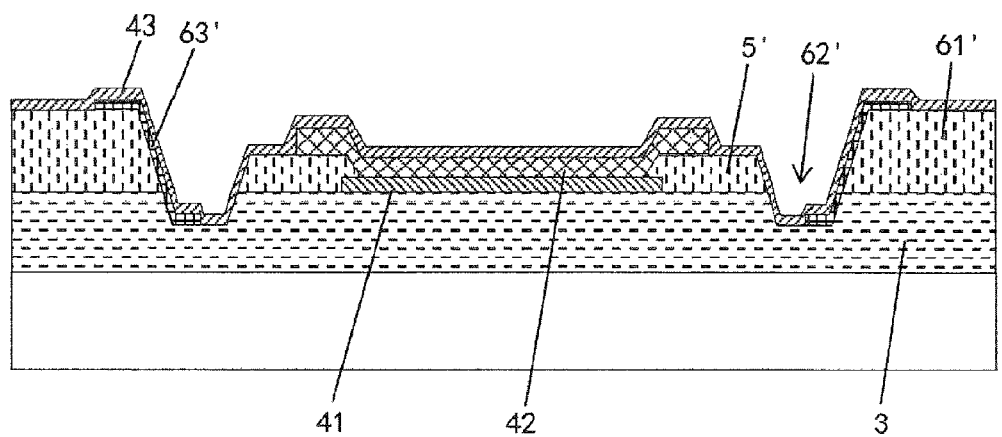

FIGS. 4a-4c are section views showing operation processes of manufacturing the pixel structure in FIG. 3. The manufacturing method of the pixel structure comprises steps of:

forming the pixel driving unit layer comprising the thin film transistor on the substrate 1 made from glass or transparent resin, for example;

forming the first insulation layer 3 on the pixel driving unit layer;

forming the first electrode layer 41 of the luminescent unit on the first insulation layer 3;

as shown in FIG. 4a, forming the insulation film 51' around the first electrode layer 41 on the first insulation layer 3 and then forming the pixel aperture in the insulation film 51'; wherein a stepped portion 52 is formed in the insulation film 51', and a height of the stepped portion 52 located inside is less than that located outside.

as shown in FIG. 4b, etching the groove 62' in the insulation film, having a relatively small height, around outer sides of the pixel aperture, so that the groove 62' separates the insulation film 51' into the pixel defining layer 5' located inside and the second insulation layer 61' located outside;

as shown in FIG. 4c, forming the reflective layer 63' on the inner walls of the groove 62 located outside; as an example, forming a reflective metal layer by depositing materials such as Ag, Al or the like through physical vapor deposition process and then removing the reflective metal layer on other portions through patterning, wet etching or dry etching process while keeping the reflective metal layer on the inner walls of the groove 62' located outside so as to form the one-side reflective layer 63'; then depositing an OLED organic film layer through fine metal mask (FMM) and evaporation processes to form the luminescent layer 42; thereafter, forming a transparent or transflective second electrode layer 43 through evaporation process.

FIGS. 6a-6d are section views showing operation processes of manufacturing the pixel structure in FIG. 5. The manufacturing method of the pixel structure comprises steps of:

forming the first insulation layer 3 on the substrate 1;

forming an annular second insulation layer 61" on the first insulation layer 3;

forming the first electrode layer 41" and the reflective layer 63" through a single patterning process, wherein the first electrode layer 41" is formed on the first insulation layer 3 and the reflective layer 63" extends from the first insulation layer 3 to an inner surface of the second insulation layer 61", and the first electrode layer 41" is disconnected from the reflective layer 63".

forming the pixel defining layer 5" on outer edges of the first electrode layer 41" and forming the groove 62" between an outer surface of the pixel defining layer 5" and the inner surface of the second insulation layer 61"; and forming the luminescent layer 42" and the second electrode layer 43" on the first electrode layer 41" such that the reflective layer 63" reflects the light entering the pixel defining layer 5" from the luminescent layer 42" to exit from the exit surface of the pixel structure. As an example, the reflective layer 63" reflects the light 21 entering the pixel defining layer 5" from the luminescent layer 42" to exit in a direction which is substantially parallel to the exit direction of the pixel structure.

As a result, the reflective layer 63" can reflect the light which is propagated laterally in the pixel defining layer 5" to exit from the exit surface of the pixel structure, and thus to form the light contributing to the display effect, thereby improving display effect and reducing light dissipation.

In an embodiment, the step of forming the pixel defining layer 5" on outer edges of the first electrode layer 41" comprises forming the pixel defining layer 5" which has a height less than a height of the second insulation layer 61".

It should be understood that the method according to embodiments of the present invention further comprises: forming the pixel driving unit layer comprising a thin film transistor on the substrate 1 made from glass or transparent resin, for example, before forming the first insulation layer 3; thereafter, forming the first insulation layer 3 on the pixel driving unit layer.

In an embodiment, as shown in FIG. 6a, a via-hole (not shown) may be formed in the first insulation layer 3 through a patterning process after the first insulation layer 3 is formed. After the first insulation layer is cured, the second insulation layer 61" is coated on the first insulation layer 3, and an aperture which is slightly larger than pixel area is formed through a patterning process, thereafter it is cured. In an alternative embodiment, the first insulation layer 3, the second insulation layer 61" and the via-hole may be formed one time by controlling a transmission rate of the exposed beams transmitting the mask, for example using a single halftone or grey tone mask in a single patterning process.

As shown in FIG. 6b, a metal electrode reflective layer or other composite conductive reflective layer is deposited on the first insulation layer 3 and the second insulation layer 61". Then the first electrode layer 41" and the metal reflective layer 63" disposed on inner walls of the aperture located outside are formed from the metal electrode reflective layer through a patterning process. The first electrode layer 41" is disconnected from the reflective layer 63".

As shown in FIG. 6c, the pixel defining layer 5" is formed on the outer edges of the first electrode layer 41" through coating and patterning processes, and the groove 62" is formed between the outer surface of the pixel defining layer 5" and the inner surface of the second insulation layer 61". The height of the pixel defining layer 5" is less than that of the second insulation layer 61". The pixel defining layer 5" covers the edges of the first electrode layer 41" and edges of the reflective layer 63" disposed on inner walls of the second insulation layer 61" opposite to the pixel defining layer 5". The groove 62" is formed between the outer wall of the pixel defining layer 5" and the inner wall of the second insulation layer 61". The pixel defining layer 5" and the second insulation layer 61" may be made from the same material, for example, may be formed by covering an organic film layer formed from materials such as acryl or polyimide (PI) and through a patterning process comprising exposure, development and etching processes, or may be formed by coating photosensitive organic material and by using exposure and development processes.

Figure 6D:
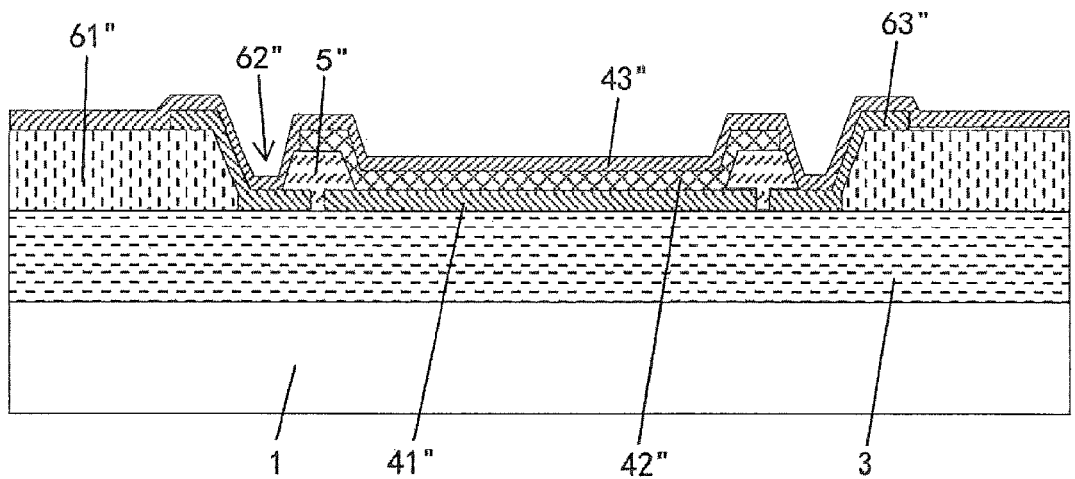

Finally, as shown in FIG. 6d, an OLED organic film layer is deposited through fine metal mask (FMM) and evaporation processes to form the luminescent layer 42"; then a transparent or transflective second electrode layer 43" is formed through evaporation process.

Figure 8A:
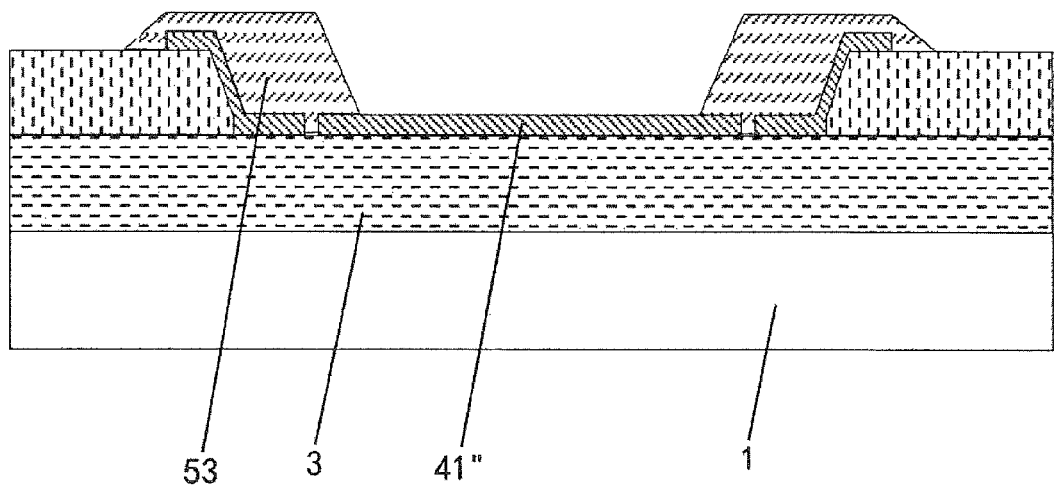
FIGS. 8a-8b are section views showing a part of operation processes of manufacturing the pixel structure in FIG. 7.
Figure 8B:
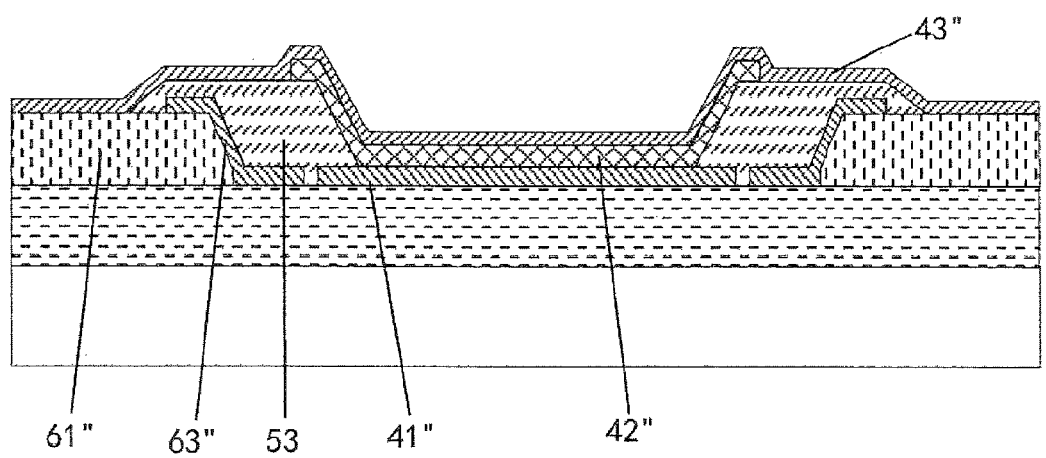

FIGS. 8a-8b are section views showing a part of operation processes of manufacturing the pixel structure in FIG. 7. It should be understood that the method comprises the steps of the method as shown in FIGS. 6a and 6b. Based on the structure as shown in FIG. 6b, as shown in FIG. 8a, the pixel defining layer 53 is formed on outer edges of the first electrode layer 41" through coating and patterning processes, and the outer surface of the pixel defining layer 53 contacts the reflective layer 63" on the inner surface of the second insulation layer 61". In other words, the pixel defining layer 53 covers the whole reflective layer 63".

Finally, as shown in FIG. 8b, an OLED organic film layer is deposited through fine metal mask (FMM) and evaporation processes to form the luminescent layer 42"; then a transparent or transflective second electrode layer 43" is formed through evaporation process.

Although the fact that the reflective assembly has the groove is described in the above pixel structures as shown in FIG. 1 and FIG. 3, the present invention is not limited thereto. It should be understood that, in an alternative embodiment, transparent insulation material may be used to fill the groove so as to planarize the surface of the pixel structure while it is necessary to keep the reflective layer. In the embodiments of the present invention, the pattering process generally includes processes such as photoresist coating, exposure, development, etching, photoresist removing and so on; alternatively, any processes through which a desired pattern will be formed may belong to a kind of patterning processes, and the present invention does not limit it.

In the pixel structure, the display device having the pixel structure and the manufacturing method of the pixel structure according to the above embodiments of the present invention, the reflective assembly is provided to reflect the light entering the pixel defining layer from the luminescent layer, so as to exit from the exit surface of the pixel structure. As a result, the light beams entering the pixel defining layer may be converted into effective beams for the pixel structure, thereby improving the display effect and reducing light dissipation.

Though the above specific embodiments are described to further explain in detail the purposes, technical solutions and advantages of the present invention, it should be understood that the above description is only the specific embodiments of the present invention but not to limit the invention. Any modifications, equivalents, improvements which are made within the spirit and principle of the present invention should be included within the scope of the present invention.

What is claimed is:

1. A pixel structure comprising:
   a first insulation layer;
   a luminescent unit disposed on the first insulation layer and comprising a first electrode layer, a luminescent layer and a second electrode layer;
   a pixel defining layer configured for defining a pixel aperture, in which the luminescent unit is disposed; and
   a reflective assembly disposed around the pixel defining layer so as to reflect light entering the pixel defining layer from the luminescent layer to exit from an exit surface of the pixel structure;
   wherein the reflective assembly comprises a reflective layer, the reflective layer and the first electrode layer are formed in the same layer and made from the same material, and the reflective layer is disconnected from the first electrode layer.

2. The pixel structure of claim 1, wherein:
   the reflective assembly further comprises:
      a second insulation layer located at the periphery of the pixel defining layer and disposed on the first insulation layer; and
      a groove formed between the second insulation layer and the pixel defining layer; and
   the reflective layer is disposed at a side of the groove located at the second insulation layer to reflect the light transmitted through the pixel defining layer.

3. The pixel structure of claim 2, wherein a bottom of the groove extends into at least a portion of the thickness of the first insulation layer.

4. The pixel structure of claim 2, wherein the second insulation layer and the pixel defining layer are formed in the same layer and made from the same material, and the second insulation layer has the same height as the pixel defining layer.

5. The pixel structure of claim 2, wherein the second insulation layer and the pixel defining layer are formed in the same layer and made from the same material, and the height of the second insulation layer is larger than the height of the pixel defining layer.

6. The pixel structure of claim 2, wherein the reflective layer has a surface of bowl shape.

7. The pixel structure of claim 1, wherein the pixel defining layer covers outer edges of the first electrode layer.

8. The pixel structure of claim 1, wherein the height of the second insulation layer is larger than the height of the pixel defining layer.

9. The pixel structure of claim 1, wherein:
   the reflective assembly further comprises a second insulation layer located at the periphery of the pixel defining layer and disposed on the first insulation layer;
   the reflective layer is disposed on an inner wall of the second insulation layer facing towards the pixel defining layer side to reflect the light emitted from the pixel defining layer; and
   an outer surface of the pixel defining layer contacts the reflective layer.

10. A display device comprising the pixel structure according to claim 1.

11. A manufacturing method of a pixel structure, each pixel structure comprising a pixel defining layer and a luminescent unit disposed in a pixel aperture of the pixel defining layer, wherein the manufacturing method comprises steps of:
   forming a first insulation layer on a substrate;
   forming a first electrode layer of the luminescent unit on the first insulation layer;
   forming an insulation film surrounding the first electrode layer on the first insulation layer;
   forming a reflective assembly on the insulation film; and
   forming a luminescent layer and a second electrode layer on the first electrode layer inside the reflective assembly such that the reflective assembly reflects light entering the pixel defining layer from the luminescent layer to exit from an exit surface of the pixel structure;
   wherein the step of forming an insulation film surrounding the first electrode layer on the first insulation layer comprises forming the insulation film with stepped portions thereon, a height of the stepped portions located inside being less than that located outside.

12. The manufacturing method of claim 11, wherein the step of forming a reflective assembly on the insulation film comprises:
   forming an annular groove on the insulation film through a patterning process so as to separate the insulation film into a second insulation layer located outside and the pixel defining layer located inside;
   forming a reflective layer on a wall of the groove located outside.

13. The manufacturing method of claim 12, wherein a bottom of the groove extends into at least a portion of a thickness of the first insulation layer.

14. The manufacturing method of claim 11, wherein the step of forming an insulation film surrounding the first electrode layer on the first insulation layer comprises forming the insulation film to cover outer edges of the first electrode layer.

15. A manufacturing method of a pixel structure, comprising steps of:
   forming a first insulation layer on a substrate;
   forming an annular second insulation layer on the first insulation layer;
   forming a first electrode layer and a reflective layer through a single patterning process, wherein the first electrode layer is formed on the first insulation layer, the reflective layer extends from the first insulation layer to an inner surface of the second insulation layer, and the first electrode layer is disconnected from the reflective layer;
   forming a pixel defining layer on outer edges of the first electrode layer; and
   forming a luminescent layer and a second electrode layer on the first electrode layer such that the reflective layer reflects light entering the pixel defining layer from the luminescent layer to exit from an exit surface of the pixel structure.

16. The manufacturing method of claim 15, wherein the step of forming a pixel defining layer on outer edges of the first electrode layer comprises forming a groove between an outer surface of the pixel defining layer and an inner surface of the second insulation layer.

17. The manufacturing method of claim 15, wherein the step of forming a pixel defining layer on outer edges of the first electrode layer comprises enabling an outer surface of the pixel defining layer to contact the reflective layer on an inner surface of the second insulation layer.

18. The manufacturing method of claim 15, wherein the step of forming a pixel defining layer on outer edges of the first electrode layer comprises forming the pixel defining layer with a height less than a height of the second insulation layer.

* * * * *